United States Patent [19]

Everett et al.

[11] Patent Number: 4,484,310
[45] Date of Patent: Nov. 20, 1984

[54] STATIC NONINVERTING MEMORY CELL FOR ONE PROPAGATION DELAY MEMORY CIRCUITS

[75] Inventors: Chauncey L. Everett; Theodore W. Houston, both of Richardson; Henry M. Darley, Plano, all of Tex.

[73] Assignee: Texas Instruments Incorporated, Dallas, Tex.

[21] Appl. No.: 363,194

[22] Filed: Mar. 29, 1982

[51] Int. Cl.[3] ............................................. G11C 11/40
[52] U.S. Cl. ...................................... 365/174; 365/154
[58] Field of Search ................ 307/279, 475; 365/174, 365/154

[56] References Cited

U.S. PATENT DOCUMENTS 4,412,336  10/1983  Peltier et al. .................... 307/279 X

*Primary Examiner*—Joseph A. Popek
*Attorney, Agent, or Firm*—William E. Hiller; James T. Comfort; Melvin Sharp

[57] ABSTRACT

A static-type noninverting memory cell for one propagation delay memory circuits which is compatible with inverting and noninverting field effect transistor logic, such as, for example, depletion mode Schottky barrier field effect transistor (MESFET) inverting logic. The basic memory cell utilizes field effect transistors and a diode, and comprises an input for receiving an input signal, a transistor operating in a switching mode and connected to the input for registering the logic state of the input signal, a memory section which includes a pair of transistors each of whose respective gates are connected to the sources, a diode interposed therebetween, and a logic state-holding transistor for retaining a stored logic state of the registered input signal, and an output terminal connected between the diode and one of the transistor pair of the memory section from which the stored logic state within the memory section may be sensed. In one embodiment, the basic memory cell is combined with noninverting logic gates to provide a one propagation delay D type flip-flop memory circuit. In another embodiment, the basic memory cell is combined with noninverting logic gates to provide a one propagation delay D bar type flip-flop memory circuit. The input and output voltages of the various embodiments of the subject invention are compatible with those of inverting and noninverting logic circuits.

20 Claims, 8 Drawing Figures

ONE-DELAY D TYPE FLIP-FLOP

STATIC NONINVERTING MEMORY CELL FOR ONE PROPAGATION DELAY MEMORY CIRCUITS

RELATED CASES

The subject matter of this patent application is related to that disclosed in copending U.S. patent application Ser. No. 324,180, filed Nov. 23, 1981, by the inventors hereof and assigned to Texas Instruments Incorporated of Dallas, Tex.

BACKGROUND OF THE INVENTION

This invention relates to a noninverting semiconductor memory cell, particularly suitable for making memory circuits having only one propagation delay from clock edge to output.

Random access memory (RAM) devices are becoming more widely used in the manufacture of digital equipment, particularly minicomputers, microprocessors and the like, as the speed and cost advantages of these devices increase. Static RAM cells and flip-flop circuits have been generally avoided, because of the delay in switching speed which results from the excessive space needed by the pair of cross-coupled inverters, or "latch", of each static RAM or flip-flop. This "pair of coupled inverters, is the basic structure of a most important and basic logic circuit, called a static latch". Herbert Taub, "Digital Circuits and Microprocessors," page 128 (McGraw-Hill Book Company, New York, 1982). Due to the coupled inverters, most circuits which use the "static latch" require at least two gate, i.e., propagation, delays from the clock edge to the output in order for the circuit to change logic states.

The history of integrated semiconductor circuit design has been characterized by a trend toward increasing speed and circuit densities. Various technologies have been invented to stimulate this trend. For example, transistor-transistor logic (TTL), was standard in digital equipment for a long time but has given way in many areas to N-channel metal oxide semiconductor (MOS) logic circuits because of their superiority in speed power product, packing density and ease of device fabrication. For these reasons, devices fabricated using these technologies are finding application primarily in memory, microprocessor, logic circuits, and the like. The Schottky barrier field effect transistor (MESFET) is another device that offers many of the advantages of the N-channel metal oxide semiconductor (MOS) technology without some of its disadvantages. Its primary application will also be in digital technology, such as memory circuits, random logic circuits, microprocessor type circuits and the like.

One of the major problems associated with MOSFET and MESFET technology, however, is the lack of noninverting logic circuits which provide only a one propagation delay switching speed. This is a very serious problem for it severely limits the number of complex logic gate types in which MESFET, and MOSFET, semiconductor devices can be used. For example, existing flip-flops are implemented using cross-coupled inverter logic gates. Due to the inverter cross-coupling, these flip-flops generally require two or three gate delays from the clock edge to the output in order for the device to change memory states.

Speed is one of the principal features of merit in any logic circuit. The term "speed" usually implies the speed at which the output changes from one state to another, i.e., the slope of the transition of the output; the delay in propagating a changed logic level through the circuit; and the rate at which the circuit can be cycled between the states, i.e., the repetition rate.

As a general principle, a semiconductor device, such as a transistor, a diode, and the like, will offer some delay in the speed at which the output signal of the device changes from one state to another in response to its input signal; i.e., the output signal will occur sometime after the input signal. Of course, every circuit, which comprises a number of circuit elements, including semiconductor devices, will therefore, also have some delay. This delay is generally known in the art as "propagation delay time", "delay time", or simply as "delay". Many circuit design failures, or design limitations, result from such undesired "delay"; for the speed at which an integrated circuit can perform a function is inversely proportional to the propagation delay of each circuit element, including the semiconductor devices in the integrated circuit. In other words, the shorter the propagation delay of the integrated circuit, the faster is its operational "speed".

In the world of digital technology, there is a very strong demand for faster and faster operational "speeds". Accordingly, considerable effort has been devoted toward the development of complex logic gates and memory circuits having minimal "delay".

SUMMARY OF THE INVENTION

It is a principal objective of this invention to provide a noninverting memory cell, for making memory circuits having only one propagation delay from clock edge to output, which is compatible with all field effect transistor (FET), including depletion mode Schottky barrier field effect transistor (MESFET), inverting and noninverting logic circuits. An additional objective is to provide a noninverting memory cell for one propagation delay high speed general purpose MESFET memory circuits which is capable of holding the stored memory state independent of a clock signal. A further objective is to provide a noninverting memory cell for one propagation delay high speed general purpose MOSFET memory circuits which is capable of holding the stored memory state independent of a clock signal.

In accordance with the invention, a noninverting memory cell for one propagation delay memory circuits is provided that is capable of implementation in integrated circuit form. The noninverting memory cell is of the static type, and is compatible with inverting and noninverting field effect transistor logic; such as, for example, depletion mode Schottky barrier field effect transistor (MESFET) inverting logic. The basic noninverting memory cell includes input means for receiving an input signal, switch means for registering the logic state of the input signal, memory means for holding the logic state of the registered input signal, and output means for sensing the stored logic state.

In one embodiment of the invention, the basic memory cell is combined with noninverting logic gates to provide a one propagation delay D-type flip-flop memory circuit. In another embodiment of the invention, the basic memory cell is combined with noninverting logic gates to provide a one propagation delay D bar-type flip-flop memory circuit.

The input and output voltages of the various embodiments of this invention are compatible with those of inverting and noninverting logic circuits. The input means of the basic noninverting memory cell may have one or more inputs depending upon the given application of the invention.

BRIEF DESCRIPTION OF THE DRAWINGS

The novel features believed characteristic of the invention are set forth in the appended claims. The invention itself, however, as well as other objectives and advantages thereof will be readily appreciated as the same becomes better understood by reference to the following detailed description of illustrative embodiments when considered in conjunction with the accompanying drawings, wherein:

DETAILED DESCRIPTION OF SPECIFIC EMBODIMENT

Figure 1:
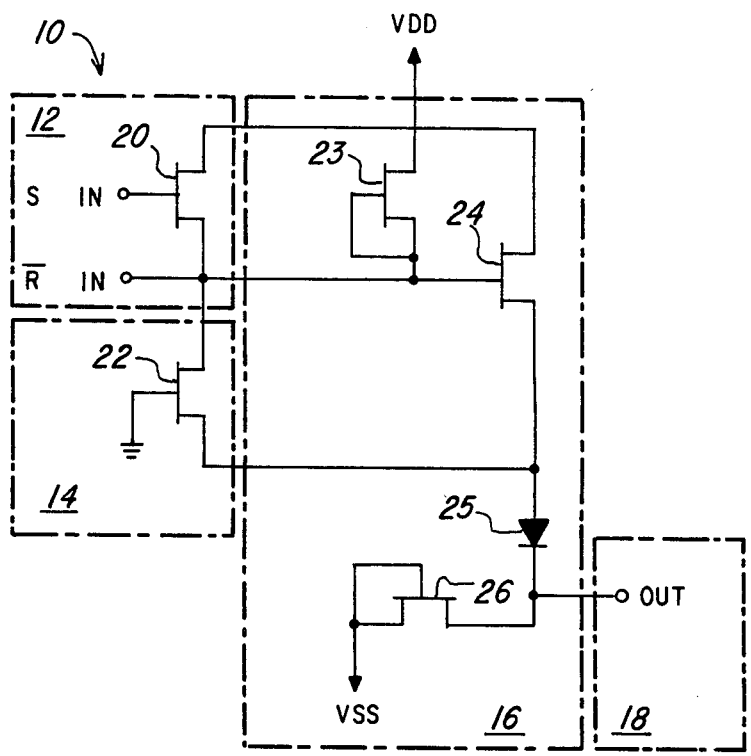
FIG. 1 is an electrical schematic diagram of the basic noninverting memory cell of the subject invention, that is used to form the one propagation delay memory circuits, having multiple input input means.
Figure 1:
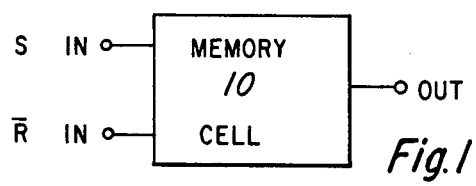

Referring to FIG. 1, a noninverting memory cell constructed in accordance with the subject invention is generally shown at 10. The noninverting memory cell 10 comprises input means, such as for example that generally shown at 12, for receiving an input signal into the memory cell 10. The cell 10 also comprises field effect transistor (FET) switch means, such as generally shown at 14, which is selectively responsive to the input means 12, for registering the logic state of the input signal. The cell 10 further comprises FET memory means, such as generally shown at 16, which is responsive to the switch means 14, for holding the logic state of the registered input signal. The memory cell 10 additionally comprises output means, such as for example generally shown at 18, which is responsive to the memory means 16, for sensing the logic state of the signal stored in the memory cell 10.

Figure 8:
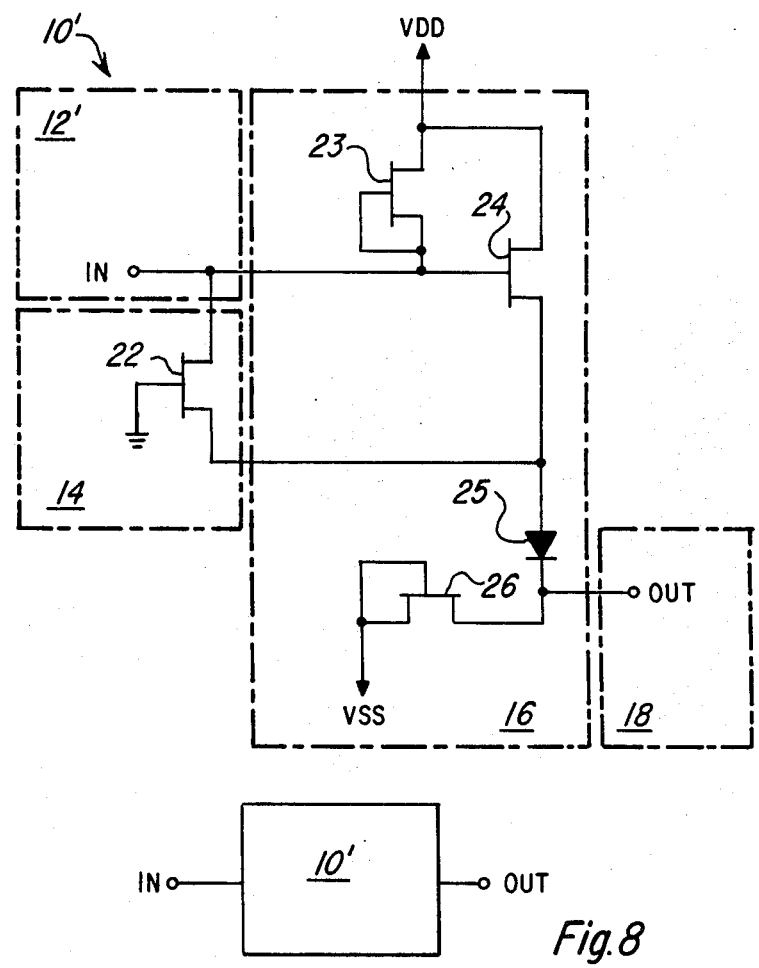
FIG. 8 is an electrical schematic diagram of the basic noninverting memory cell having single input input means.

Alternatively, the input means 12 may have multiple inputs, such as for example that generally illustrated at 12 in FIG. 1, or the input means may have a single input, such as for example that generally shown at 12' in FIG. 8. Of course, the particular number of inputs that may be utilized by the cell of the subject invention depends upon the given application thereof.

As will be seen, the memory cell 10, as best illustrated in FIG. 1, or the memory cell 10', as best illustrated in FIG. 8, can be utilized in combination with noninverting amplifier circuits to construct a one propagation delay memory circuit. Both the cells 10 and 10', as well as the one propagation delay memory circuits of the subject invention use the noninverting amplifier circuit described and claimed in U.S. patent application Ser. No. 324,180, entitled "A Noninverting Amplifier Circuit for One Propagation Delay Complex Logic Gates", filed Nov. 23, 1981 and assigned to Texas Instruments Incorporated of Dallas, Tex.

U.S. patent application Ser. No. 324,180, is hereby incorporated by reference.

Turning now to the operation of the noninverting memory cell 10, the following discussion shall assume that the reader has a basic understanding of the operation of the noninverting amplifier circuit described in U.S. patent application Ser. No. 324,180, filed Nov. 23, 1981.

It should be appreciated by those persons of ordinary skill in the art that the input and output voltages of the various embodiments which utilize the memory cell (10 or 10') are compatible with those of the noninverting amplifier circuit disclosed in U.S. patent application Ser. No. 324,180. In other words, the input and output voltages of the various embodiments disclosed herein are compatible with those of both inverting and noninverting logic circuits. When using, for example, semiconductor device thresholds of a $-0.5$ V, a relatively high supply voltage, such as a drain supply voltage ($V_{DD}$), of a $+1.5$ V, and a relatively low supply voltage, such as a source supply voltage ($V_{SS}$) of a $-1.5$ V, the input and output voltage levels of the noninverting memory cell 10 (and 10') are approximately a $-0.8$ V for a logic "0" and a $+0.3$ V for a logic "1".

As the voltage level of the "S" input signal to the noninverting memory cell 10 goes high, i.e., to a $+0.3$ V or a logic "1", the source of transistor 20 will follow the voltage level of the "S" input signal on the gate of transistor 20 approximately up to the drain supply voltage ($V_{DD}$), of a $+1.5$ V; because positive feedback will reduce the drain current of transistor 22, i.e., the source voltage of transistor 22 is moved in the positive direction relative to its gate voltage. As the "S" input signal approaches its most positive voltage level, transistor 22, in the switch means 14, is turned off, i.e., there is no drain current in transistor 22, and thereafter current through transistor 23, in the memory means 16, will cause transistor 24, in the memory means 16, to hold the source of transistor 20, in the input means 12, approximately equal to the drain supply voltage ($V_{DD}$), of $+1.5$ V. In other words, the memory cell 10 has switched into the logic "1" state.

If the "S" input signal is then lowered to a logic "0," or allowed to float, the source of transistor 20 will remain approximately equal to the drain supply voltage ($V_{DD}$) of $+1.5$ V. In short, the memory cell 10 will remember or hold the logic "1" state, because of the current through transistor 23 in the memory means 16.

As the voltage level of the "R bar" input signal to the noninverting memory cell 10 goes low, i.e., goes to a $-0.8$ V or a logic "0", the source of transistor 24 will follow "R bar", i.e., will be pulled low, and the transistor 22, in the switch means 14, will be turned on, i.e., transistor 22 will begin conducting drain current, and thereafter current through transistor 26, in the memory means 16, will hold the source of transistor 22 low enough for transistor 22 to remain on, i.e., continue to conduct drain current. In other words, the memory cell 10 has changed to the logic "0" state.

If the "R bar" input signal is then released, or allowed to float, the source of transistor 20 will remain low due to the current through transistor 22. In short, the memory cell 10 will remember or hold the logic "0" state, since transistor 22 is on or conducting.

It should be appreciated by those persons of ordinary skill in the art that while the field effect transistor thresholds of $-0.5$ V, the drain supply voltage ($V_{DD}$) of $+1.5$ V, the source supply voltage ($V_{SS}$) of $-1.5$ V, and the input and output voltage levels of approximately −0.8 volts for logic "0" and +0.3 V for logic "1" are typically MESFET values, these values can also be used to render any other field effect transistors, such as MOSFET, operational as well. It, therefore, should be clearly understood by those persons that the actual values used will depend upon the particular application of the subject invention and is a mere matter of design choice. Thus, the use of the above values herein is intended as merely words of description rather than of limitation, i.e., many other values can be utilized effectively by the subject invention. In short, without departing from the scope of the appended claims, those persons of ordinary skill in the art will be able to specify the circuit parameters, such as the type of field effect transistors including enhancement or depletion mode, the device thresholds, the supply voltages, the device length/width ratios, the input/output voltages, and the like, which are most suitable for their specific application of the subject invention.

The semiconductor devices used by the noninverting memory cell may be made of any suitable semiconductor material, such as for example, gallium arsenide (GaAs) or silicon (Si).

It also should be appreciated by those persons of ordinary skill in the art that the subject invention is suited for use in integrated circuits.

Figure 2:
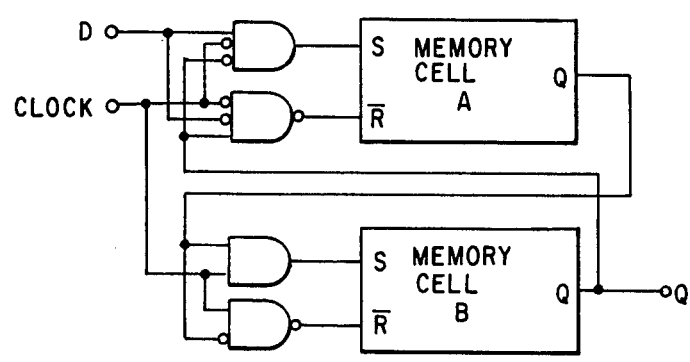
FIG. 2 is a logic diagram of a one propagation delay D type flip-flop memory circuit made in accordance with the subject invention.

Referring now to FIG. 2. FIG. 2 is a logic diagram of a one propagation delay D-type flip-flop memory circuit that uses the memory cell 10 of FIG. 1 in combination with the logic gates described in U.S. patent application Ser. No. 324,180. As used in this description and in the appended claims, the phrase "D-type flip-flop" means a D-type flip-flop having only a Q output signal. The memory circuit of FIG. 2, i.e., the D-type flip-flop memory circuit made in accordance with the invention, has only one propagation delay from clock edge to output, and is compatible with all field effect transistor (FET), including depletion mode Schottky barrier field effect transistor (MESFET), inverting and noninverting logic circuits.

The one propagation delay is for the output going positive as well as negative. Generally, prior art crosscoupled inverter D-type flip-flops, i.e., the conventional D-type flip-flops, have two propagation delays in one direction and three propagation delays in the other direction. In other words, the flip-flop of FIG. 2, and FIG. 3, will toggle at a clock frequency two (2) and one-half (½) to three (3) times faster than most conventional "static latch" flip-flops.

Figure 3:
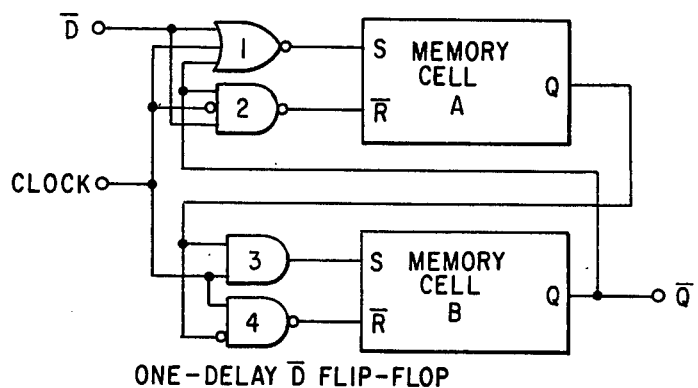
FIG. 3 is a logic diagram of a one propagation delay D bar type flip-flop memory circuit made in accordance with the subject invention.
Figure 4:
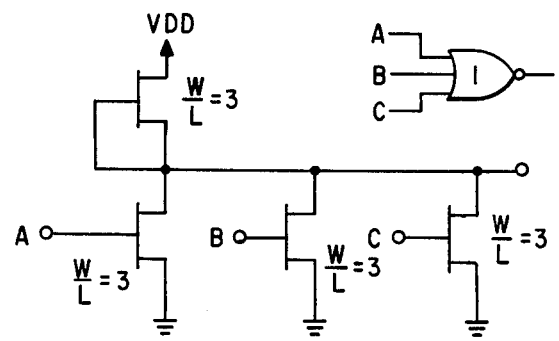
FIGS. 4–7 are electrical schematic sectional diagrams of the logic diagram of FIG. 3.
Figure 5:
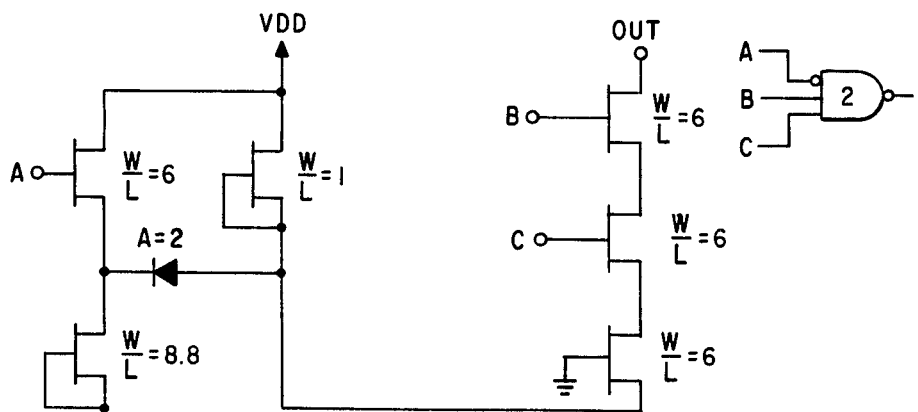
Figure 6:
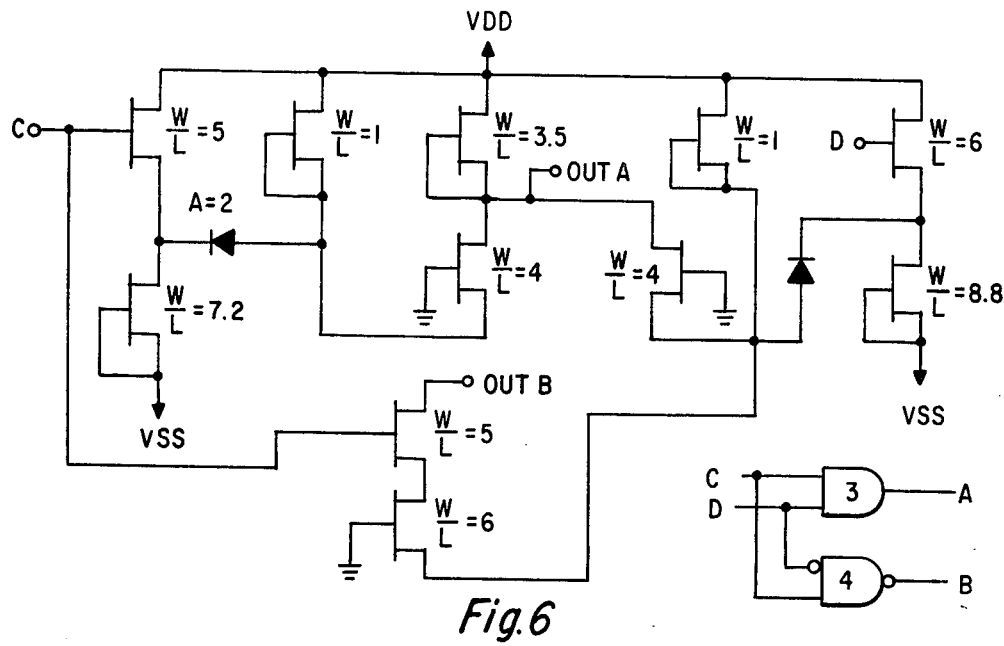

FIG. 3 is a logic diagram of a one propagation delay D bar-type flip-flop memory circuit that uses the memory cell 10 of FIG. 1 in combination with the logic gates. As used in this description and in the appended claims, the phrase "D bar (D̄)-type flip-flop," means a D bar-type flip-flop having only a Q bar (Q̄) output signal. One means of obtaining complementary signals is by utilizing one propagation delay D bar-type flip-flops in combination with one propagation delay D-type flip-flops. FIGS. 4–7 are electrical schematic diagrams of the gate detail of the one propagation delay D bar-type flip-flop of FIG. 3. When the D-type flip-flop of FIG. 2 is connected as a toggle, i.e., its output Q is connected to the input D bar of FIG. 3, each memory cell A, in FIGS. 2 and 3, will change stages every time the clock goes "low" and each memory cell B will change states every time the clock signal goes "high". Only one gate delay of propagation time is needed to set the D bar input during the half clock period prior to the positive going edge. One gate delay after the positive going clock, the output Q bar will either set or clear depending upon the state of the D bar input.

Figure 7:
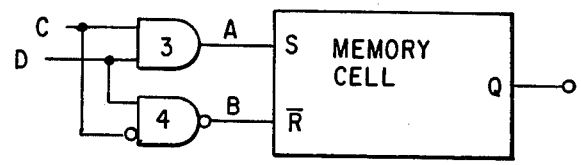
Figure 7:
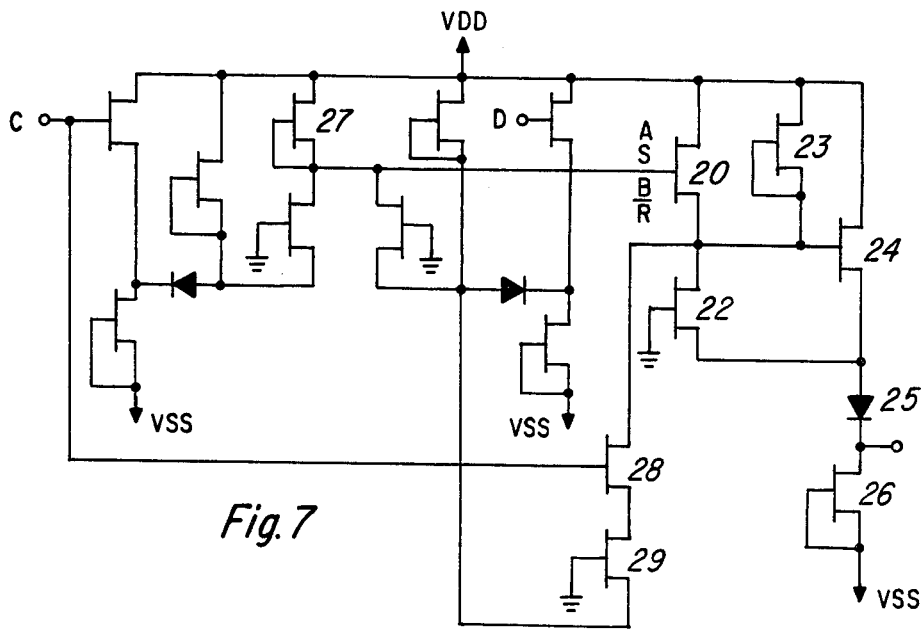

It should, of course, be appreciated by those persons of ordinary skill in the art that the gate detail illustrated in FIG. 7 is the portion of the flip-flops which is common to both the D-type, as best illustrated in the lower half of FIG. 2, and the D bar-type, as best illustrated at 3 and 4 in FIG. 3.

Referring to FIG. 7, if D is "high" and Q is "low" the clock input going positive will cause the source of transistor 27 to rise toward the drain supply voltage ($V_{DD}$). Input D being "high", will cause transistor 29 to be off such that the source of transistor 20, i.e., the input R bar of the memory cell, follows the S input toward the drain supply voltage ($V_{DD}$). The positive feedback due to the source of transistor 24 rising or increasing the source of transistor 22 will cause the source of transistor 20, i.e., the input R bar, to substantially reach the drain supply voltage $V_{DD}$. The transistors 24 and 26, as well as the diode 25, are biased in the linear mode so that Q, i.e., the output, follows the input R bar without any substantial delay. The propagation delay from the clock edge to the output is principally the delay caused by the AND gate 3.

When D and the clock are "low", and Q is "high", then S is low. Transistor 29 will thus be on, and upon the clock going high, R bar will be pulled "low" through transistors 28 and 29. The positive feedback caused by transistor 24 pulling down the source of transistor 22 will drive R bar to the "low" voltage. The propagation delay from the clock edge to the output is principally the delay required to pull R bar to the "low" voltage or state.

Although the invention has been described with reference to specific embodiments, a large variety of one propagation delay memory circuits can be constructed utilizing the subject invention. The invention, therefore, has been described in an illustrative manner, and it is to be understood that the terminology which has been used is intended to be in the nature of words of description rather than of limitation.

Obviously, many modifications and variations of the present invention are possible in light of the above teachings. It is, therefore, to be clearly understood that within the scope of the appended claims, the subject invention may be practiced otherwise than as specifically described.

The embodiments of the invention in which an exclusive property or privilege is claimed are defined as follows:

1. A static noninverting memory cell for a one propagation delay memory circuit, which comprises:
   (a) a first field effect transistor having a gate, source, and drain;
   (b) a second field effect transistor having a gate, source, and drain;
   (c) means for connecting a drain voltage supply to the drain of said first transistor;
   (d) means for connecting the gate of said first transistor to an input signal;
   (e) means for connecting the source of said first transistor to the drain of said second transistor;
   (f) means for connecting the source of said first transistor, and the drain of said second transistor, to another input signal;

(g) means for connecting the gate of said second transistor to a constant voltage reference source;

(h) a third field effect transistor having a gate, source, and drain;

(i) means for connecting the drain voltage supply to the drain of said third transistor;

(j) means for connecting the gate of said third transistor to the source of said third transistor;

(k) means for connecting the source-gate of said third transistor to the drain of said second transistor, and the source of said first transistor;

(l) a fourth field effect transistor having a gate, source, and drain;

(m) means for connecting the drain voltage supply to the drain of said fourth transistor;

(n) means for connecting the gate of said fourth transistor to the source-gate of said third transistor, and the source-drain of said first and second transistor, respectively;

(o) means for connecting the source of said fourth transistor to the source of said second transistor;

(p) a diode having a cathode and an anode;

(q) means for connecting the anode of said diode to the source of said second, and said fourth, transistor;

(r) a fifth field effect transistor having a gate, source, and drain;

(s) means for connecting the cathode of said diode to the drain of said fifth transistor;

(t) means for connecting the gate of said fifth transistor to the source of said fifth transistor;

(u) means for connecting the gate-source of said fifth transistor to a source voltage supply;

(v) said third, fourth, and fifth field effect transistors, and said diode defining a memory section in which a logic state may be retained; and (w) output means connected at a location between the cathode of said diode and the drain of said fifth transistor and responsive to said memory section for sensing the logic state retained therein.

2. A one propagation delay memory circuit having logic gates in combination with at least one noninverting memory cell, said noninverting memory cell comprising:

(a) a first field effect transistor having a gate, source, and drain;

(b) a second field effect transistor having a gate, source, and drain;

(c) means for connecting a drain voltage supply to the drain of said first transistor;

(d) means for connecting the gate of said first transistor to an input signal;

(e) means for connecting the sources of said first transistor to the drain of said second transistor;

(f) means for connecting the source of said first transistor, and the drain of said second transistor, to another input signal;

(g) means for connecting the gate of said second transistor to a constant voltage reference source;

(h) a third field effect transistor having a gate, source and drain;

(i) means for connecting the drain voltage supply to the drain of said third transistor;

(j) means for connecting the gate of said third transistor to the source of said third transistor;

(k) means for connecting the source-gate of said third transistor to the drain of said second transistor, and the source of said first transistor;

(l) a fourth field effect transistor having a gate, source, and drain;

(m) means for connecting the drain voltage supply to the drain of said fourth transistor;

(n) means for connecting the gate of said fourth transistor to the source-gate of said third transistor, and the source-drain of said first and second transistors, respectively;

(o) means for connecting the source of said fourth transistor to the source of said second transistor;

(p) a diode having a cathode and an anode;

(q) means for connecting the anode of said diode to the source of said second, and said fourth, transistor;

(r) a fifth field effect transistor having a gate, source, and drain;

(s) means for connecting the cathode of said diode to the drain of said fifth transistor;

(t) means for connecting the gate of said fifth transistor to the source of said fifth transistor;

(u) means for connecting the gate-source of said fifth transistor to a source voltage supply;

(v) said third, fourth, and fifth field effect transistors, and said diode defining a memory section in which a logic state may be retained; and (w) output means connected at a location between the cathode of said diode and the drain of said fifth transistor and responsive to said memory section for sensing the logic state retained therein.

3. A memory circuit as set forth in claim 2, wherein said field effect (FET) transistors comprises Schottky barrier field effect (MESFET) transistors.

4. A memory circuit as set forth in claim 3, wherein said MESFET transistors comprise depletion mode MESFET transistors.

5. A memory circuit as set forth in claim 3, wherein said MESFET transistors comprise enhancement mode MESFET transistors.

6. A memory circuit as set forth in claim 2, wherein said field effect (FET) transistors comprise metal oxide semiconductor field effect (MOSFET) transistors.

7. A memory circuit as set forth in claim 6, wherein said MOSFET transistors comprise depletion mode MOSFET transistors.

8. A memory circuit as set forth in claim 6, wherein said MOSFET transistors comprise enhancement mode MOSFET transistors.

9. A memory circuit as set forth in claim 2, wherein said one propagation delay memory circuit comprises a "D type flip-flop" memory circuit.

10. A memory circuit as set forth in claim 2, wherein said one propagation delay memory circuit comprises a "D bar-type flip-flop" memory circuit.

11. A static noninverting memory cell for a one propagation delay memory circuit, which comprises:

(a) a first field effect transistor having a gate, source, and drain;

(b) means for connecting the drain of said first transistor to an input signal;

(c) means for connecting the gate of said first transistor to a constant voltage reference source;

(d) a second field effect transistor having a gate, source, and drain;

(e) means for connecting a drain voltage supply to the drain of said second transistor;

(f) means for connecting the gate of said second transistor to the source of said second transistor;

(g) means for connecting the source-gate of said second transistor to the drain of said first transistor;
(h) a third field effect transistor having a gate, source, and drain;
(i) means for connecting the drain voltage supply to the drain of said third transistor;
(j) means for connecting the gate of said third transistor to the source-gate of said second transistor and the drain of said first transistor;
(k) means for connecting the source of said third transistor to the source of said first transistor;
(l) a diode having a cathode and an anode;
(m) means for connecting the anode of said diode to the source of said first transistor and the source of said third transistor;
(n) a fourth field effect transistor having a gate, source, and drain;
(o) means for connecting the cathode of said diode to the drain of said fourth transistor;
(p) means for connecting the gate of said fourth transistor to the source of said fourth transistor;
(q) means for connecting the gate-source of said fourth transistor to a source voltage supply;
(r) said second, third, and fourth field effect transistors, and said diode defining a memory section in which a logic state may be retained; and
(s) output means connected at a location between the cathode of said diode and the drain of said fourth transistor and responsive to said memory section for sensing the logic state retained therein.

12. A one propagation delay memory circuit having logic gates in combination with at least one noninverting memory cell, said noninverting memory cell comprising:
(a) a first field effect transistor having a gate, source, and drain;
(b) means for connecting the drain of said first transistor to an input signal;
(c) means for connecting the gate of said first transistor to a constant voltage reference source;
(d) a second field effect transistor having a gate, source, and drain;
(e) means for connecting a drain voltage supply to the drain of said second transistor;
(f) means for connecting the gate of said second transistor to the source of said second transistor;
(g) means for connecting the source-gate of said second transistor to the drain of said first transistor;
(h) a third field effect transistor having a gate, source, and drain;
(i) means for connecting the drain voltage supply to the drain of said third transistor;
(j) means for connecting the gate of said third transistor to the source-gate of said second transistor and the drain of said first transistor;
(k) means for connecting the source of said third transistor to the source of said first transistor;
(l) a diode having a cathode and an anode;
(m) means for connecting the anode of said diode to the source of said first transistor and the source of said third transistor;
(n) a fourth field effect transistor having a gate, source, and drain;
(o) means for connecting the cathode of said diode to the drain of said fourth transistor;
(p) means for connecting the gate of said fourth transistor to the source of said fourth transistor;
(q) means for connecting the gate-source of said fourth transistor to a source voltage supply;
(r) said second, third, and fourth field effect transistors, and said diode defining a memory section in which a logic state may be retained; and
(s) output means connected at a location between the cathode of said diode and the drain of said fourth transistor and responsive to said memory section for sensing the logic state retained therein.

13. A memory circuit as set forth in claim 12, wherein said field effect (FET) transistors comprise Schottky barrier field effect (MESFET) transistors.

14. A memory circuit as set forth in claim 13, wherein said MESFET transistors comprise depletion mode MESFET transistors.

15. A memory circuit as set forth in claim 13, wherein said MESFET transistors comprise enhancement mode MESFET transistors.

16. A memory circuit as set forth in claim 12, wherein said field effect (FET) transistors comprise metal oxide semiconductor field effect (MOSFET) transistors.

17. A memory circuit as set forth in claim 16, wherein said MOSFET transistors comprise depletion mode MOSFET transistors.

18. A memory circuit as set forth in claim 16, wherein said MOSFET transistors comprise enhancement mode MOSFET transistors.

19. A memory circuit as set forth in claim 12, wherein said one propagation delay memory circuit comprises a "D type flip-flop" memory circuit.

20. A memory circuit as set forth in claim 12, wherein said one propagation delay memory circuit comprises a "D bar-type flip-flop" memory circuit.

* * * * *